United States Patent

[11] 3,552,630

[72] Inventor John A. Dean
Brea, Calif.
[21] Appl. No. 767,198
[22] Filed Oct. 14, 1968
[45] Patented Jan. 5, 1971
[73] Assignee the United States of America, as represented by the Secretary of the Air Force, by mesne assignments

[54] HEAT SINK AND HOLDING DEVICE
4 Claims, 1 Drawing Fig.

[52] U.S. Cl. .................................................. 228/46,
165/80, 165/185; 219/161; 228/51, 228/57
[51] Int. Cl. .................................................. B23k 1/00
[50] Field of Search .................................................. 228/46, 51,
57, 59; 269/287; 219/161; 165/185, 80

[56] References Cited

UNITED STATES PATENTS

| | | | |
|---|---|---|---|
| 2,541,828 | 2/1951 | Peck | 165/80X |
| 2,808,576 | 10/1957 | Brown | 165/80X |
| 3,178,905 | 4/1965 | Boynton | 228/59X |
| 3,230,338 | 1/1966 | Kawecki | 219/161X |
| 3,237,833 | 3/1966 | Michaud | 228/46X |
| 3,358,751 | 12/1967 | Berwald et al. | 228/46X |

*Primary Examiner*—John F. Campbell
*Assistant Examiner*—Robert J. Craig
*Attorneys*—Harry A. Herbert, Jr. and Arsen Tashjian

ABSTRACT: A heat sink and holding device for use in soldering a plurality of electrical leads. The complete array of electrical leads is connected to a common heat sink which also holds all of the leads while each lead is soldered individually. The device comprises two spring clips of high heat conductive material connected to a base of heavy material and having a nonskid bottom. One of the spring clips comes in contact with each wire lead and acts as the main heat sink portion. The other spring clip acts primarily as a holder.

PATENTED JAN 5 1971
3,552,630
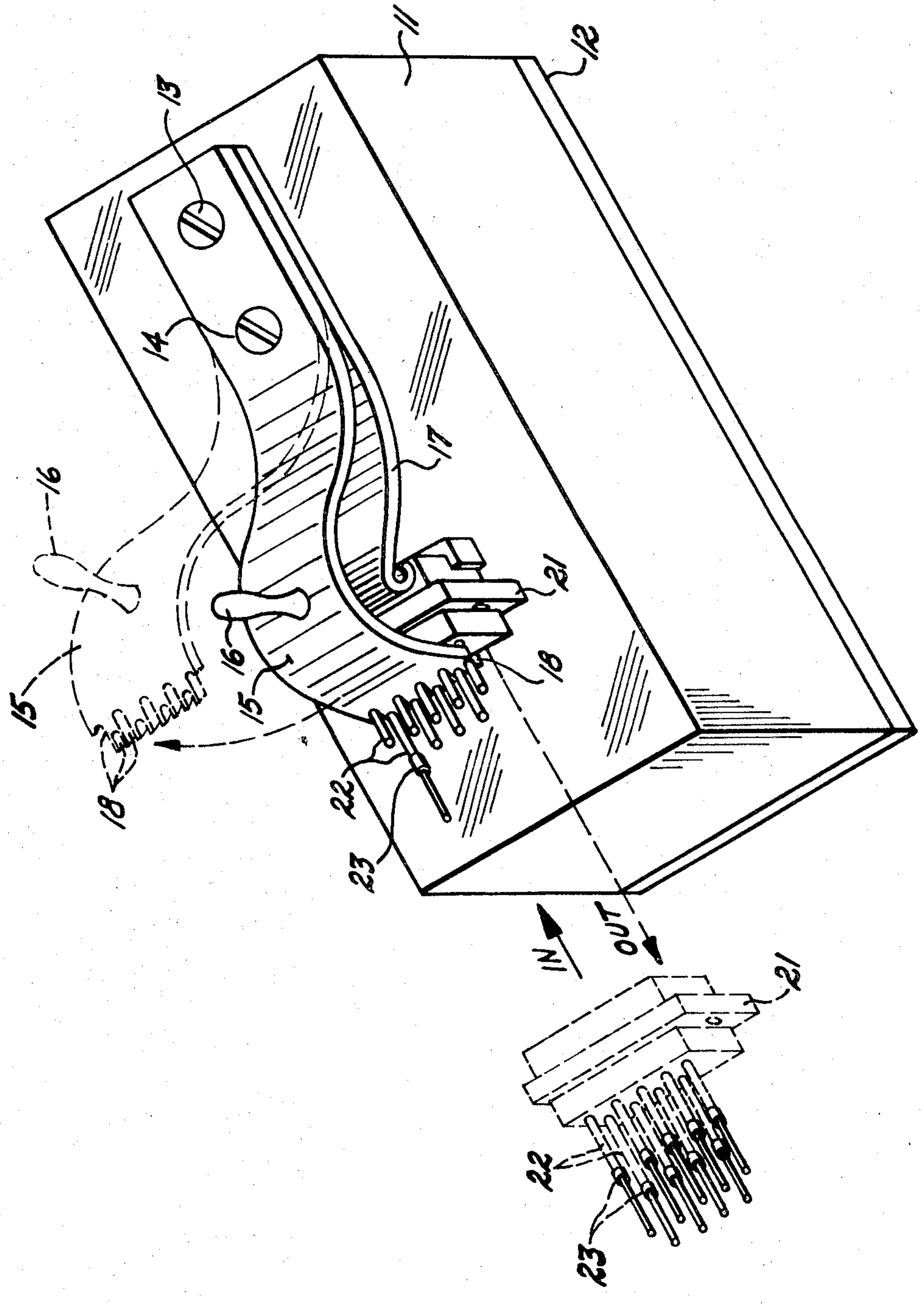
INVENTOR.
JOHN A. DEAN
BY Harry A. Herbert Jr. and Arsen Tashjian
ATTORNEYS

HEAT SINK AND HOLDING DEVICE

BACKGROUND OF THE INVENTION

This invention relates to the connection of electrical leads to terminals and more particularly to simultaneously holding, soldering and heat sinking a plurality of electrical leads.

In the prior art there are many methods and devices for joining electrical leads to terminals. One of the most commonly used methods is soldering. The use of solder as a joining medium is commonplace and is becoming more prevalent with the more extensive use of printed circuits, miniaturization, and the other factors connected with the rapid advances in the electrical and electronics industries.

In soldering, as in other heat joining methods, a critical problem is effective heat dissipation to prevent the excessive heating or the undesired melting of the parts to be joined (i.e., the lead and the terminal) or of nearby parts or components. The problem has been minimized by heat sinking the lead to be soldered.

The most effective and economical of the heat sinks used is of the clip type. It may be accurately said that it is the most prevalent heat sink used in the soldering art; and, that in its least sophisticated embodiment, it may be nothing more than a metal alligator-type clip.

Irrespective of the particular configuration of the clip-type heat sink used, the present, preferred method of soldering is to solder each lead individually, i.e., one at a time; and, as a result, each lead is heat sinked as it is soldered. This makes necessary moving the heat sink from one lead to the next as each lead is soldered. This creates a time and motion problem which has not, to date, been solved. In this regard, it is pertinent to point out that the use of a plurality of heat sinks (i.e., one for each lead) also involves an undesirable time and motion problem, even if it is possible to use a plurality of heat sinks. However, it may not be possible to use, simultaneously, a plurality of heat sinks, simply because of a lack of space between leads.

Further, and as important, is the fact, and problem, of holding the lead while it is being soldered.

This invention solves all of the foregoing problems and others related thereto; fulfills a current critical need; and, thereby, advances the state of the art.

SUMMARY OF THE INVENTION

This invention pertains to the simultaneous holding, soldering and heat sinking of a plurality of electrical leads.

Therefore, an object of this invention is to provide a device which will permit effective heat or thermal dissipation during a soldering operation.

Obviously, another object of the invention is to allow the holding of the lead to be soldered while said lead is being soldered and, at the same time, heat sink.

Still another object of this invention is to permit the saving of time and motion in soldering operations involving a plurality of leads to be soldered.

A further object of the invention is to provide a device which is reliable, simple in construction, and economical to manufacture, and, yet, will permit the attainment of the foregoing objects and other objects related thereto.

These, and still other, objects of the invention will become readily apparent after a consideration of the description of the invention and of the drawing.

DESCRIPTION OF THE DRAWING

The drawing is a perspective view of a preferred embodiment of the invention, showing in phantom the movement of a principal component of the invention. Also shown is a typical electrical connector, with a plurality of leads to be soldered, during the soldering operation, and in phantom before and after the soldering.

DESCRIPTION OF THE PREFERRED EMBODIMENT

With reference to the drawing, the preferred embodiment comprises a base 11, having a nonskid bottom 12, to which said base 11 are affixed, by retainers 13 and 14, spring clip 15 with handle 16 and a separate spring clip 17.

Base 11 is of heavy material, such as brass which also permits additional heat dissipation, but is readily movable by lifting. Bottom 12 may be made nonskid by scoring or other suitable means. Spring clips 15 and 17 are of resilient material having a high heat or thermal dissipation property, such as copper berryllium. Both spring clips 15 and 17 are essentially strips, substantially wider than they are thick. Each spring clip 15 and 17 is affixed to base 11 at one end and are curved downwardly at the other end. The curved nonaffixed end of spring clip 15 has slots or scallops 18 at the periphery or edge thereof. Handle 16 is made of material which is not heat conductive, such as wood.

Again with reference to the drawing, miniature electrical connector 21 has a plurality of electrical leads 22 which are already affixed to said connector 21. Each lead 22 requires soldering, individually, to a separate terminal, such as 23. After the soldering operation, each lead 22 will have a terminal, such as 23, soldered at its terminus.

MODE OF OPERATION OF THE PREFERRED EMBODIMENT

When terminals, such as 23, are to be soldered to individual leads 22 of electrical connector 21, handle 16, which is affixed to spring clip 15, is grasped and raised to a position as indicated by phantom in the drawing. Connector 21 is positioned on base 11, with leads 22 facing to the reader's left and with the bottom of connector 21 abutting the top of base 11. In that position, connector 21 is then pushed under the curved nonaffixed end of spring clip 17, so that said curved end firmly holds connector 21. Handle 16, and thereby spring clip 15, is lowered until slots or scallops 18 of spring clip 15 mate with, rest on, and otherwise come in contact with, leads 22. Handle 16 is then released.

As a result, each of the leads 22 may be separately (i.e., one at a time) soldered to a terminal, such as 23, with the heat generated by the soldering operation being effectively dissipated by spring clips 15 and 17.

After the soldering operation has been completed, in the sense that all leads 22 have been soldered to their respective terminals 23, connector 21 is removed from my invention by lifting handle 16 with spring clip 15 and pulling connector 21 from under spring clip 17.

Although reference has been made to the use of the invention in the soldering art, and in so doing a specific connector with definitely located leads has been used to explain the mode of operation of the preferred embodiment, it is to be noted that such references are by way of illustration only, and not by way of limitation. Obviously, my invention may be used in any art where rapid heat or thermal dissipation is desired or required.

Additionally, while there has been shown and described the fundamental features of my invention, as applied to a preferred embodiment, it is to be understood that various substitutions and omissions may be made by those skilled in the art, without departing from the spirit of the invention. For example: (a) Spring clips 15 and 17 need not be affixed to a movable base, but rather may be affixed directly to a work table; (b) The number and the configuration of the slots or scallops 18 at the periphery or edge of the curved nonaffixed end of spring clip 15 may be varied as to number, configuration and the like; and (c) The parts to be soldered need not be terminal-to-lead, but may be, for example, wire-to-wire.

I claim:

1. A heat sink and holding device, comprising:

a. a base;

b. a resilient first strip having the property of high heat dissipation, affixed at one end to said base and curved downwardly towara said base at the other end;

c. a resilient second strip having the property of high heat dissipation, abutting upon said first strip, and similarly affixed at one end to said base and curved downwardly toward said base at the other end, but longer than said first strip, with said downwardly curved end of the second strip overlapping the downwardly curved end of said first strip and having at the periphery thereof a plurality of slots; and d. a handle of heat nonconductive material affixed to said second strip.

2. A device, as set forth in claim 1, wherein said base is made of brass and has a nonskid bottom.

3. A device, as set forth in claim 1, wherein said first strip is made of copper berryllium.

4. A device, as set forth in claim 1, wherein said second strip is made of copper berryllium.